United States Patent [19]

Hendrickson

[11] 4,317,228
[45] Feb. 23, 1982

[54] TELEVISION RECEIVER HAVING MULTIPLEXED PHASE LOCK LOOP TUNING SYSTEM

[75] Inventor: Melvin C. Hendrickson, Elmhurst, Ill.

[73] Assignee: Zenith Radio Corporation, Glenview, Ill.

[21] Appl. No.: 84,707

[22] Filed: Oct. 15, 1979

[51] Int. Cl.³ .............................................. H04B 1/26
[52] U.S. Cl. .................................... 455/183; 455/260; 455/316; 331/2; 331/18
[58] Field of Search ................ 455/76, 165, 183, 260, 455/196, 208, 209, 314–316, 3; 331/2, 14, 17, 18, 25, 1 A; 358/86

[56] References Cited

U.S. PATENT DOCUMENTS

| | | | |
|---|---|---|---|
| 3,409,836 | 11/1968 | Wallett | 455/183 |
| 3,927,384 | 12/1975 | Jezo | 331/2 |
| 4,078,212 | 3/1978 | Rast | 455/183 |
| 4,097,816 | 6/1978 | Imazeki et al. | 331/2 |
| 4,123,724 | 10/1978 | Das et al. | 455/183 |
| 4,127,820 | 11/1978 | Beelitz et al. | 455/183 |
| 4,135,157 | 1/1979 | Den Toonder | 455/196 |

Primary Examiner—Jin F. Ng
Attorney, Agent, or Firm—John H. Coult; Jack Kail

[57] ABSTRACT

A television receiver includes a frequency synthesizer phase lock loop operated in a time multiplexed manner to provide two tuning signals for tuning a received television signal. The two tuning signals are developed at the outputs of first and second voltage controlled local oscillators alternately operated in response to a phase detector which is reset at the beginning of each alternate operation.

11 Claims, 5 Drawing Figures

TELEVISION RECEIVER HAVING MULTIPLEXED PHASE LOCK LOOP TUNING SYSTEM

BACKGROUND OF THE INVENTION

The present invention relates generally to television receiver tuning systems and, in particular, to television receivers employing a "double tuning" arrangement for tuning a received television signal.

In the design of television receivers it is frequently necessary to employ a "double tuning" arrangement wherein a received television signal is initially converted by a first tuning stage and then converted again by a second tuning stage for application to the receiver's video and audio processing circuits. Such "double tuning" arrangements are, for example, normally used to process television signals transmitted in STV (subscription television) and CATV (community antenna television) systems. In these types of systems, a television signal, sometimes not receivable on conventional VHF or UHF channels, is initially converted to a frequency corresponding to the RF carrier signal of a low VHF channel, e.g. channel 2, 3 or 4, by a special converter circuit typically located externally of the television receiver. The converted signal is then coupled to the conventional tuner of the television receiver and converted to an IF signal which is processed for developing the audio and video components of the selected low VHF channel.

Conventionally, both the tuning apparatus located in the external converter circuit and the tuning apparatus located internally of the television receiver have employed resonant LC tank circuits to realize appropriate local oscillator signals for performing their respective tuning functions. While these LC circuits provide adequate performance, they are subject to a number of factors which necessitate the inclusion of manually operable fine tuning controls. The fine tuning controls typically operate a trimmer capacitor or the like for precisely adjusting the generated local oscillator signal so as to effect a properly tuned output from the stage's mixer circuit. In order to overcome the nuisance effect of fine tuning controls and to provide a more reliable and accurate tuning operation, modern day television receivers frequently employ frequency synthesis techniques in their tuning sections.

Frequency synthesis tuning systems employ digital techniques wherein a crystal controlled reference signal is coupled to one input of a frequency and phase detector, the frequency divided output of a voltage controlled local oscillator being coupled to the frequency and phase detector's second input. The frequency and phase detector develops an output error signal which is coupled through a filter to the control input of the voltage controlled local oscillator for equalizing the values of the frequency of the reference signal and the divided output of the local oscillator. In accordance with this arrangement, the frequency of the local oscillator may be precisely set for tuning a desired television signal by appropriately selecting a division factor for dividing the local oscillator output frequency prior to its application to the phase detector. Thus, the local oscillator may be tuned to any desired television channel by selecting a suitable division factor appropriately related to the desired television channel.

While frequency synthesis tuning systems of the type described above are in widespread use in conventional television receiver tuning circuits, they are normally not used in the tuning circuits of external converter circuits due to the expense of providing two separate frequency synthesis tuning systems in association with a single television receiver. As a result, the converter circuit must include manual fine tuning controls thereby defeating the "hands-off" operation which would otherwise be possible in view of the frequency synthesis system used in the receiver's tuning stage. And, as mentioned above, while a second frequency synthesis system could be utilized in the converter, such would involve substantial additional expense.

In accordance with the foregoing, it is a basic object of the present invention to provide, in association with a television receiver "double tuning" arrangement, a system whereby the benefits of frequency synthesis tuning techniques are enjoyed by both tuning stages but with the concomitant costs of only a single frequency synthesis system.

DESCRIPTION OF THE PREFERRED EMBODIMENT

Figure 1:
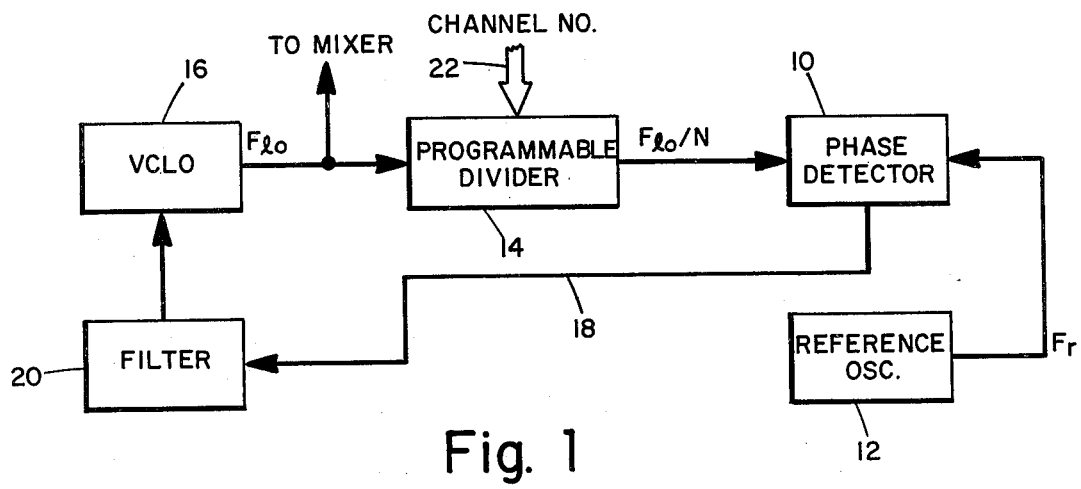
FIG. 1 is a block diagram of a conventional frequency synthesis television tuning system employing a phase lock loop.

Referring now to the drawings, FIG. 1 illustrates a conventional frequency synthesis television receiver tuning system employing a phase lock loop for achieving television signal tuning without the necessity for employing manual fine tuning controls. A tuning system of this general type is fully disclosed in U.S. Pat. No. 4,156,197 to Merrell and assigned to the assignee of the present invention, which patent is hereby incorporated by reference. Briefly, in tuning systems of this variety, a frequency and phase detector 10 includes a first input supplied with a reference signal having a frequency $F_r$ from a reference oscillator 12. A second input of the phase detector 10 is supplied with the output of a programmable frequency divider 14 whose division ratio control input is supplied with data reflecting a selected channel number and whose data input is supplied from the output of a voltage controlled local oscillator 16. The output of the programmable divider 14 therefore comprises a signal having a frequency corresponding to the frequency of the local oscillator divided by a factor N, the factor N having a value determined in accordance with a selected television channel. The frequency and phase detector 10 is operative for developing an output error signal on a line 18 for controlling the voltage controlled local oscillator 16 through a filter 20 so as to equalize the frequencies of the signals developed at the outputs of the reference oscillator 12 and the programmable divider 14.

In accordance with the foregoing, the phase detector 10 is operable for controlling the voltage controlled local oscillator 16 for developing a local oscillator signal having a frequency $F_{lo}$ such that the expression $F_{lo}=F_rN$ is satisfied. Thus, the voltage controlled local oscillator may be operated for achieving a suitable local oscillator signal for tuning a desired television channel by appropriately selecting the division ratio N characterizing the programmable divider 14. A suitable binary code representing a selected television channel, and therefore corresponding to a particular division ratio N, may be supplied to the programmable divider 14 in parallel format via a bus 22 in response to operation of the television receiver tuning controls.

As mentioned previously, it is frequently necessary to employ a "double tuning" arrangement wherein a received television signal is processed through two separate tuning stages connected in a cascaded arrangement. To realize such a "double tuning" arrangement it is necessary to supply two separate local oscillator signals, each of the local oscillator signals being supplied to the mixer circuit of a respective one of the tuning stages. According to the present invention, such a "double tuning" arrangement is provided in a system whereby the benefits of phase lock loop frequency synthesis tuning techniques are enjoyed by both tuning stages but with the concommitant costs of only a single frequency synthesis system.

Figure 2:
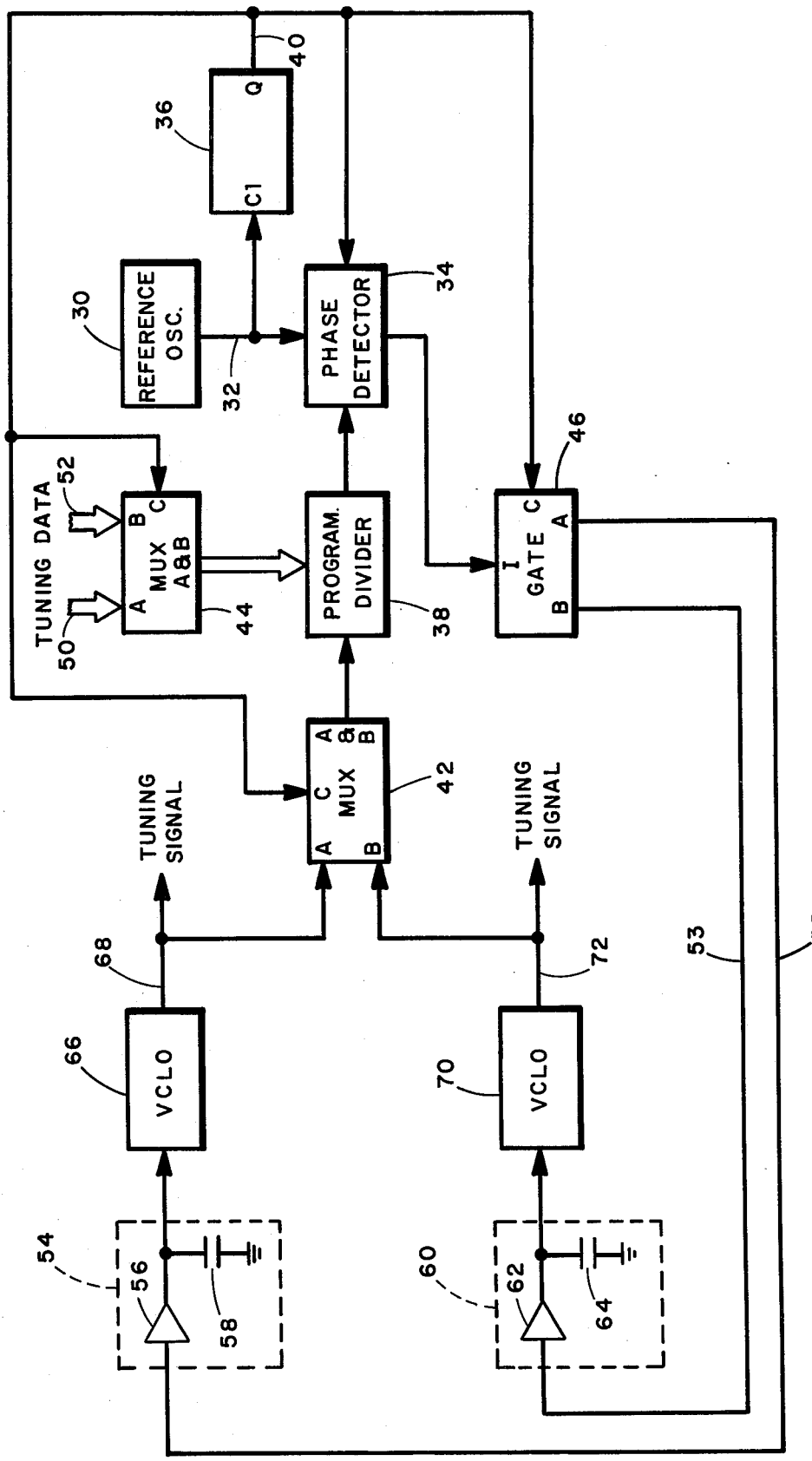
FIG. 2 is a block diagram of the double stage television receiver tuning system of the present invention.

The "double tuning" frequency synthesis tuning arrangement of the present invention is illustrated in detail in FIG. 2. The system essentially comprises a single phase lock loop which is operated in a multiplexed mode for independently controlling the operation of two separate voltage controlled local oscillators, each of the voltage controlled local oscillators developing a local oscillator signal for controlling an associated tuning stage.

Referring in more detail to FIG. 2, the system comprises a crystal controlled reference oscillator 30 developing an output reference signal on a line 32 preferably having a frequency of about 4 khz. The reference signal developed on line 32 is supplied to one input of a frequency and phase detector 34 and to the clock input of a toggle flip-flop 36. The output of the flip-flop 36 is coupled to a line 40 for controlling the operation of a pair of multiplexers 42 and 44 and a gate 46. The output 40 of flip-flop 36 is also connected to the reset input of the phase detector 34. Each of the multiplexers 42 and 44 comprises a controllable gating circuit having two data inputs A and B, a control input C connected to line 40 and an output A+B. Each of the multiplexers 42 and 44 is characterized in that data is coupled from the A input of the multiplexer to its output A+B in response to the control input C being presented with a logic signal having a first state while data is coupled from the B input to the output A+B in response to control input C being presented with a logic signal having the complimentary state. The gate 46 comprises a controlled circuit having a data input I, a control input C and two data outputs A and B. Data is coupled from the data input I to the gate output A in response to the presentation of a logic signal to control input C having a first state and data is coupled from the data input I to the second gate output B in response to the presentation of a logic signal to the control input C having the complimentary state.

The data input A of multiplexer 44 is connected to a bus 50 for receiving an encoded signal adapted for programming a programmable divider 38, whose output is connected to the second input of the phase detector 34, for assuming a division ratio selected for achieving a first tuning signal controlling the operation of a first tuning stage of a television receiver. The data input B of multiplexer 44 is in a similar manner connected to a bus 52 for receiving a different encoded signal adapted for programming the programmable divider 38 for assuming a different division ratio selected for achieving a second tuning signal controlling the operation of a second tuning state of the television receiver. The A output of the gate 46 is connected by a conductor 55 to the input of a first low-pass filter 54 comprising an operational amplifier 56 and a capacitor 58. The B output of the gate 46 is connected by a conductor 53 to the input of a second low-pass filter 60 also comprising an operational amplifier 62 and a capacitor 64. The output of the filter 54 is connected to the control input of a first voltage controlled local oscillator 66 whose output is, in turn, connected by a conductor 68 to the data input A of the multiplexer 42. The output of the second filter 60 is likewise connected to the control input of a second voltage controlled local oscillator 70 whose output is, in turn, connected by a conductor 72 to the data input B of the multiplexer 42.

In operation, the flip-flop 36 is initially caused to assume a first logic state in response to the reference signal developed on conductor 32. As a result, a signal representing the assumed state of the flip-flop is coupled to the control inputs of the multiplexers 42 and 44 and the gate 46, the state change of the flip-flop 36 also being effective for resetting the phase detector 34. The multiplexer 44 is therefore operated for sampling the encoded tuning information presented on one of the buses 50 and 52 while the multiplexer 42 is operated for sampling one of the outputs of the voltage controlled local oscillators 66 and 70. Also, the gate 46 is operated for coupling the output of the phase detector 34 to one of the output conductors 53 and 55.

It will be assumed for purposes of illustration that the first state of the flip-flop 35 results in the multiplexer 44 sampling the tuning information supplied on bus 50, the multiplexer 42 for sampling the output of the voltage controlled local oscillator 66 and the gate 46 coupling the output of the phase detector 34 to conductor 55. It will be appreciated that in this mode of operation, the circuit of FIG. 2 effectively comprises a phase lock loop consisting of the phase detector 34, the filter 54, the voltage controlled local oscillator 66 and the programmable divider 38. This phase lock loop is operative in a conventional manner for developing a tuning signal at the output of the voltage controlled local oscillator 66 whose frequency is determined by the reference signal developed on conductor 32 and the encoded tuning information supplied on bus 50. In particular, assuming that the tuning information supplied on bus 50 results in the programmable divider being characterized by a division ratio N, the frequency of the tuning signal developed at the output of the voltage controlled local oscillator 66 may be represented by the expression $NF_r$, where $F_r$ is the frequency of the reference signal.

After one period of the reference signal on conductor 32 has transpired the flip-flop 36 will assume its complimentary state resetting the phase detector 34 and operating the multiplexers 42 and 44 for sampling the signals supplied to their B inputs and for operating the gate 46 for coupling the output of the phase detector 34 to conductor 53. In this mode of operation the circuit of FIG. 2 effectively comprises a phase lock loop consisting of the phase detector 34, the filter 60, the voltage controlled local oscillator 70 and the programmable divider 38. This phase lock loop is effective for tuning the voltage controlled local oscillator 70 for producing a second local oscillator tuning signal according to the expression $F_rM$, where M represents the division ratio characterizing the programmable divider 38 in response to the tuning information supplied on bus 52.

It will thus be seen that as the flip-flop 36 continuously changes state in response to the reference signal on line 32 the circuit of FIG. 2 will alternately comprise a first phase lock loop adapted for developing a tuning signal at the output of the voltage controlled local oscillator 66 and a second phase lock loop adapted for developing a different tuning signal at the output of the voltage controlled local oscillator 70. In accordance with this technique, both local oscillators of a dual stage tuning system are operated under the control of a phase lock loop without the necessity of providing duplicate phase lock loop systems.

Figure 3:
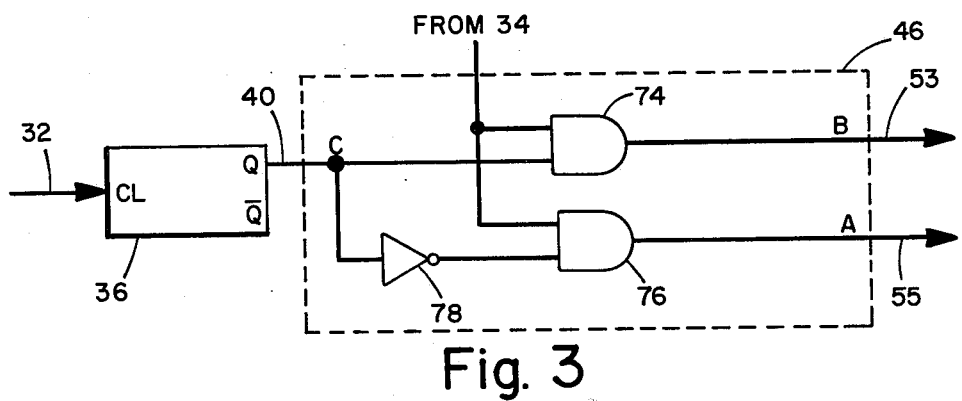
FIG. 3 is a logic diagram illustrating an embodiment of the gate circuit shown generally in FIG. 2.

An embodiment of the gate 46 is illustrated in FIG. 3. The gate 46 comprises a pair of AND gates 74 and 76 each having one input connected to the output of the phase detector 34. The second input of the AND gate 74 is connected to the Q output of flip-flop 36 by conductor 40 while the second input of the AND gate 76 is connected to the Q output of flip-flop 36 through an inverter 78. When the flip-flop 36 is in its Q=1 state the AND gate 74 is enabled while the AND gate 76 is inhibited. Therefore, the error signal developed at the output of the phase detector 34 is coupled through the AND gate 74 to the B output of gate 46 and therefrom to the conductor 53. When the flip-flop 36 is clocked to its Q=0 state in response to the reference signal on line 32, the AND gate 76 is enabled and the AND gate 74 is inhibited. Consequently, the error signal developed at the output of the phase detector 34 is coupled through AND gate 76 to the A output of the gate 46 and therefrom to conductor 55.

Figure 4:
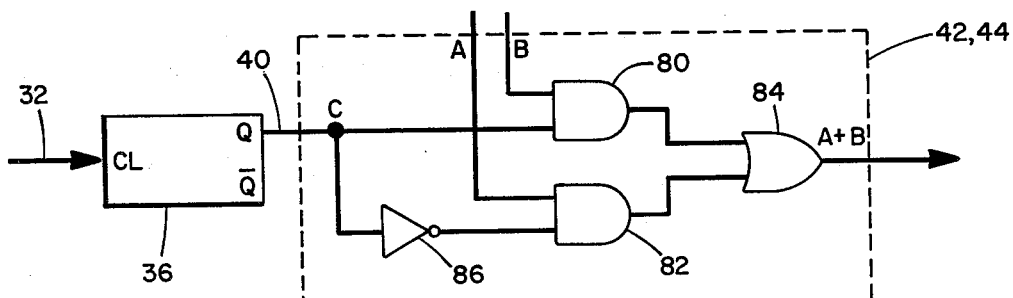
FIG. 4 is a logic diagram illustrating an embodiment of the multiplexer circuits shown generally in FIG. 2.

An implementation of the multiplexers 42 and 44 is illustrated in FIG. 4. Each of the multiplexers comprises a pair of AND gates 80 and 82 whose outputs are coupled through an OR gate 84 to the output of the multiplexer. One input of the AND gate 80 is connected directly to the Q output of flip-flop 36 and one input of the AND gate 82 is connected to the Q output of flip-flop 36 through an inverter 86. The second input of AND gate 80 is connected to the B input of the multiplexer while the second input of the AND gate 82 is connected to the A input of the multiplexer. In this regard, it will be appreciated that the A and B inputs, as well as the A+B output will comprise multiconductor buses in the case of multiplexer 44 and only single conductors in the case of multiplexer 42. However, in either event, when the flip-flop 36 assumes its Q−1 state the gate 80 is enabled while the gate 82 is inhibited. Consequently, data presented to the B input of the multiplexer is coupled through AND gate 80 and OR gate 84 to the output of the multiplexer. During the complementary state of the flip-flop 36 the gate 82 is enabled while the gate 80 is inhibited. In this case, data presented to the A input of the multiplexer is coupled through AND gate 82 and OR gate 84 to the output of the multiplexer.

The selection of a suitable circuit for implementing the phase detector 34 is of considerable importance to achieving proper system operation. More specifically, most conventional phase detectors are characterized by a number of unknown states which may be assumed upon initiating operation of the detector. Such detectors therefore require a period of time to settle to a stable state during which inaccurate directional information may be achieved. Even though this time period is normally of relatively short duration and not particularly objectionable in the environment of a conventional phase lock loop system, such is highly undesirable in connection with the present invention in that the phase detector must be capable of responding immediately to input data since it is being alternately operated for relatively short time periods for controlling two voltage controlled oscillators. That is, during one state of the flip-flop 36 the phase detector 34 must be substantially immediately responsive for coupling a control signal to one of the voltage controlled local oscillators. This control signal will be held by the associated filter while the phase detector couples control signals to the other voltage controlled local oscillator during the complementary state of the flip-flop. Control signals are thus alternately coupled by the phase detector to the voltage controlled local oscillators until both are properly tuned. In order to prevent the phase detector from initiating operation of an unkown state, the previously mentioned U.S. Pat. No. 4,156,197 teaches the use of a resettable phase detector. A reset pulse coupled to this variety of phase detector effectively forces the detector into a stable state insuring the immediate development of accurate directional information. By employing such a phase detector in the circuit of FIG. 2 the possibility of not deriving accurate directional information from the phase detector during the relatively short alternations of the system is eliminated.

Figure 5:
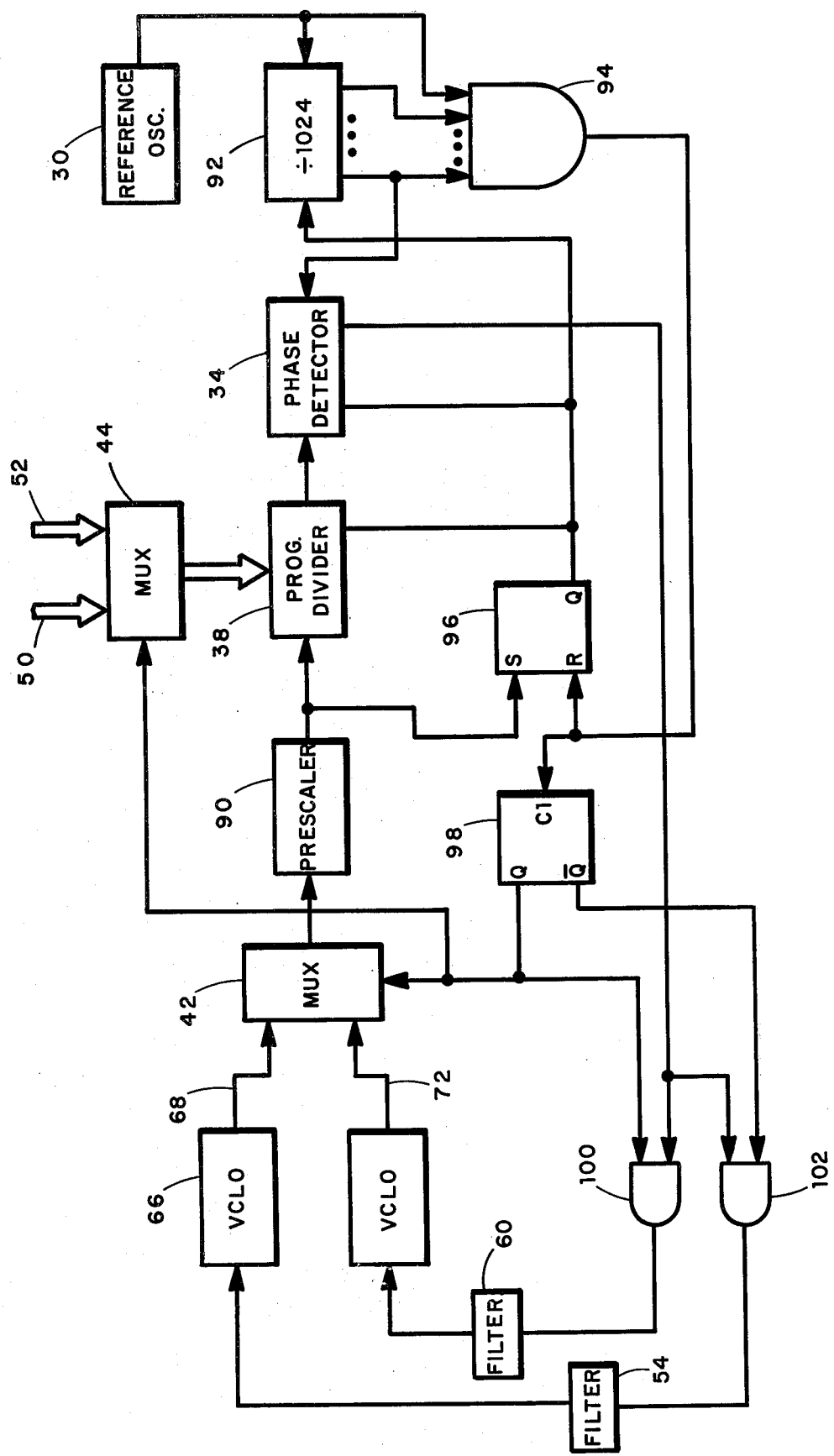
FIG. 5 is a block diagram of an alternate embodiment of the double stage television receiver tuning system of the invention.

FIG. 5 illustrates an alternate embodiment of the invention wherein a prescaler 90 is connected between the multiplexer 42 and the programmable divider 38. The prescaler 38, which comprises a frequency divider typically having a division ratio of 1024, is used to reduce the frequency of the signals developed by the voltage controlled local oscillators 66 and 70 to a range compatible with the programmable divider 38. Prescaling of this type is particularly important for the upper UHF channels where frequencies as high as 910 MHz are encountered. Due to the multiplex operation of the invention, it is desirable to reset the prescaler each time a different tuning loop is effected so that accurate tuning information may immediately be derived from the detector 34. However due to the frequencies involved, resetting the prescaler is very difficult. In fact, most commercially available prescaler chips are supplied without reset terminals. As will be explained below, the circuit of FIG. 5 overcomes this problem by using the prescaler as the controlling instead of the controlled circuit element whereby the circuit is operated in its multiplexed mode as if the prescaler were reset each time a new tuning loop is effected.

Referring in detail to FIG. 5, it will be observed that the illustrated circuit is similar to the circuit of FIG. 2 in many respects. In particular, the circuit includes voltage controlled local oscillators 66 and 70 controlled by the output of the frequency and phase detector 34 through the filters 54 and 60 respectively, the outputs of the oscillators 66 and 70 being coupled by multiplexer 42 and a prescaler 90 to one input of the programmable divider 38. Also, tuning data is coupled to the programmable divider 38 by means of buses 50 and 52 and the multiplexer 44 as before. The output of the programmable divider 38 is coupled to one input of the frequency and phase detector 34, the detectors's other input being supplied from the final output stage of a divider 92 operated in response to the reference oscillator 30 which has an output frequency of about 4 MHz. As will be explained in further detail hereinafter, the circuit is operable in a first multiplexed mode for establishing a tuning loop including filter 54, voltage controlled local oscillator 66, prescaler 90, programmable divider 38 and the combination of divider 92 and reference oscillator 30. In this first multiplexed mode, the circuit is operative for developing a tuning signal as previously explained in response to tuning data supplied by one of the buses 50 and 52. The circuit is also operable in a second multiplexed mode for establishing a second tuning loop including filter 60, voltage controlled local oscillator 70, prescaler 90, programmable divider 38 and the combination of divider 92 and reference oscillator 30. In this second multiplexed mode, the circuit is operative for developing a tuning signal in response to tuning data supplied by the other bus 50 or 52.

Switching between the first and second tuning loops is controlled by a series of logic element including a multiple input AND gate 94, an R-S flip-flop 96 and a toggle flip-flop 98. The AND gate 94 receives as inputs the signals developed at all of the output stages of the divider 92 as well as an input from the reference oscillator 30. The output of the AND gate 94 is coupled to the clock input of flip-flop 98 and to the reset input of flip-flop 96. The Q output of flip-flop 98 is coupled to the control inputs of multiplexers 42 and 44 and to one input of an AND gate 100 forming part of the gate 46. The Q output of flip-flop 98 is connected to one input of an AND gate 102 also forming part of gate 46. Flip-flop 96, which is set in response to the output of prescaler 90, includes a Q output coupled to the reset terminals of the programmable divider 38, the frequency and phase detector 34 and the divider 92.

In operation, the first reference oscillator pulse occurring during each period of the signal coupled by the divider 92 to the detector 34 is gated by AND gate 94 for clocking flip-flop 98 and for resetting flip-flop 96. Flip-flop 98 is thereby effective for establishing one of the tuning loops discussed above with the programmable divider 38, the detector 34 and the divider 92 being held in reset. The prescaler 90, however, continues to receive an input from the multiplexer 42 and eventually develops an output pulse setting the flip-flop 96 which removes the reset signal from dividers 38 and 92 and from the detector 34. At this time, the prescaler 90 is also in its reset state so that all critical circuit elements of the tuning loop have been suitably conditioned for providing accurate tuning information. The first reference oscillator pulse occurring during the next period of the signal coupled by divider 92 to detector 34 causes AND gate 94 to clock flip-flop 98 thereby establishing the second tuning loop. At the same time, AND gate 94 resets flip-flop 96 which, in turn, resets dividers 38 and 92 and detector 34. And, as before, the first pulse developed at the output of prescaler 90 sets flip-flop 96 removing the reset signal from dividers 38 and 39 and detector 34 thereby establishing operation of the loop. The foregoing process is continuously repeated whereby the first and second tuning loops are alternately established with the output of the prescaler 90 controlling the operation thereof. In this manner, each tuning loop is operated for producing accurate tuning information without the necessity of physically resetting the prescaler 90.

While particular embodiments of the invention have been shown and described, it will be obvious to those skilled in the art that changes and modifications may be made without departing from the invention in its broader aspect, and, therefore, the aim in the appended claims to cover all such changes and modifications as fall within the true spirit and scope of the invention.

What is claimed is:

1. Apparatus for simultaneously generating first and second local oscillator signals in response to simultaneously developed first and second tuning information signals, each of said local oscillator signals being adapted for operating a respective tuning system of a television receiver, said apparatus comprising:
   a reference oscillator;
   a first voltage controlled local oscillator controllable for generating said first local oscillator signal;
   a second voltage controlled local oscillator controllable for generating said second local oscillator signal;
   phase lock loop means responsive to said reference oscillator for alternately forming a first phase lock loop incorporating said first voltage controlled local oscillator and a second phase lock loop incorporating said second voltage controlled local oscillator, said first phase lock loop being responsive to said first tuning information signal for controlling said first voltage controlled local oscillator signal for continuously generating said first local oscillator signal and said second phase lock loop being responsive to said second tuning information signal for controlling said second voltage controlled local oscillator for continuously generating said second local oscillator signal; and
   said phase lock loop means including a resettable phase detector and means for resetting said phase detector each time one of said first and second phase lock loops is formed.

2. The apparatus according to claim 1 wherein said phase lock loop means further comprises a programmable frequency divider alternately operated for dividing the output of said first voltage controlled local oscillator according to said first tuning information signal and for dividing the output of said second voltage controlled local oscillator according to said second tuning information signal, said phase detector being responsive to said reference oscillator and to said frequency divider for developing an output error signal alternately controlling said first and second voltage controlled local oscillators.

3. The apparatus according to claim 2 including bistable means responsive to said reference oscillator and means responsive to said bistable means for alternately coupling said first and second tuning information signals for programming said frequency divider, for alternately coupling said first and second voltage controlled local oscillators to said frequency divider and for coupling said error signal for alternately controlling said first and second voltage controlled local oscillators.

4. The apparatus according to claim 2 including means connected for prescaling the outputs of said first and second voltage controlled local oscillators and divider means connected between said reference oscillator and said phase detector.

5. The apparatus according to claim 4 including means responsive to said divider means and to said reference oscillator for coupling a reset signal to said programmable divider, phase detector and divider means each time one of said phase lock loops is formed.

6. The apparatus according to claim 5 including means responsive to a predetermined state of said prescaling means for removing said reset signal subsequent of the forming of said phase lock loops.

7. Apparatus responsive to first and second simultaneously developed tuning information signals for simultaneously generating first and second local oscillator signals respectively, each of said local oscillator signals being adapted for operating a respective tuning system of a television receiver, said apparatus comprising:
   a reference oscillator;
   a phase lock loop responsive to said reference oscillator, said phase lock loop including first and second voltage controlled oscillator means each controllable for generating a respective one of said first and second local oscillator signals;
   control means responsive to said reference oscillator for alternately operating said phase lock loop in response to said first and second tuning information signals for alternately controlling said first and second voltage controlled oscillator means for continuously generating both of said local oscillator signals; and
   said phase lock loop including a resettable phase detector for developing an error signal controlling said first and second voltage controlled local oscillator means and means for resetting said phase detector in response to each alternate operation of said phase lock loop.

8. The apparatus according to claim 7 wherein said phase lock loop includes a programmable frequency divider operated for alternately dividing the outputs of said first and second voltage controlled local oscillator means by divisors determined according to said first and second tuning information signals.

9. Apparatus for simultaneously generating first and second local oscillator signals in response to simultaneously developed first and second tuning information signals, each of said local oscillator signals being adapted for operating a respective tuning system of a television receiver, said apparatus comprising:
   a reference oscillator;
   a first voltage controlled local oscillator controllable for generating said first local oscillator signal;
   a second voltage controlled local oscillator controllable for generating said second local oscillator signal;
   phase lock loop means responsive to said reference oscillator for alternately forming a first phase lock loop incorporating said first voltage controlled local oscillator and a second phase lock loop incorporating said second voltage controlled local oscillator, said first phase lock loop being responsive to said first tuning information signal for controlling said first voltage controlled local oscillator for continuously generating said first local oscillator signal and said second phase lock loop being responsive to said second tuning information signal for controlling said second voltage controlled local oscillator for continuously generating said second local oscillator signal; and
   said phase lock loop means including a resettable phase detector, prescaling means coupled between said phase detector and said first and second voltage controlled local oscillators, means responsive to said reference oscillator for coupling a reset signal to said phase detector each time one of said first and second phase lock loops is formed and means responsive to a predetermined state of said prescaling means for removing said reset signal subsequent of the forming of said first and second phase lock loops.

10. Apparatus responsive to first and second simultaneously developed tuning information signals for simultaneously generating first and second local oscillator signals respectively, each of said local oscillator signals being adapted for operating a respective tuning system of a television receiver, said apparatus comprising:
   a reference oscillator;
   a phase lock loop responsive to said reference oscillator, said phase lock loop including first and second voltage controlled oscillator means each controllable for generating one of said first and second local oscillator signals;
   control means responsive to said reference oscillator for alternately operating said phase lock loop in response to said first and second tuning information signals for alternately controlling said first and second voltage controlled oscillator means for continuously generating both of said local oscillator signals; and
   said phase lock loop including a resettable phase detector for developing an error signal controlling said first and second voltage controlled local oscillator means, prescaling means coupled between said phase detector and said first and second voltage controlled local oscillator means, means responsive to said reference oscillator for coupling a reset signal to said phase detector at the beginning of each alternate operation of said phase lock loop and means responsive to a predetermined state of said prescaling means for removing said reset signal subsequent of the beginning of each alternate operation of said phase lock loop.

11. The method of simultaneously generating first and second local oscillator signals in response to simultaneously developed first and second tuning information signals respectively, each of said local oscillator signals being adapted for operating a respective tuning system of a television receiver, said method comprising:
   generating a reference signal;
   alternately forming a first phase lock loop responsive to said reference signal and to said first tuning information signal for continuously developing said first local oscillator signal and a second phase lock loop responsive to said reference signal and to said second tuning information signal for continuously developing said second local oscillator signal, said first and second phase lock loops including a common resettable phase detector; and
   resetting said phase detector each time one of said first and second phase lock loops is formed.

* * * * *